United States Patent
Lee et al.

(10) Patent No.: US 10,602,627 B2
(45) Date of Patent: Mar. 24, 2020

(54) KEY DEVICE OF ELECTRONIC DEVICE

(71) Applicant: Samsung Electronics Co., Ltd., Gyeonggi-do (KR)

(72) Inventors: Sungho Lee, Gumi-si (KR); Hyosung Kang, Gumi-si (KR); Sangjin Kim, Gumi-si (KR); Sungsun Park, Suwon-si (KR); Dongchul Song, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 15/430,183

(22) Filed: Feb. 10, 2017

(65) Prior Publication Data
US 2017/0238431 A1    Aug. 17, 2017

(30) Foreign Application Priority Data
Feb. 12, 2016 (KR) .................. 10-2016-0016286

(51) Int. Cl.
*H05K 5/02* (2006.01)
*H05K 5/00* (2006.01)
*H05K 7/14* (2006.01)

(52) U.S. Cl.
CPC ......... *H05K 5/0217* (2013.01); *H05K 5/0017* (2013.01); *H05K 5/0247* (2013.01); *H05K 7/1427* (2013.01)

(58) Field of Classification Search
None
See application file for complete search history.

(56) References Cited

U.S. PATENT DOCUMENTS

| | | | | |
|---|---|---|---|---|
| 5,740,019 A | * | 4/1998 | Lee ..................... | H05K 7/142 361/752 |
| 7,083,439 B1 | * | 8/2006 | Hayakawa ........... | H01R 13/443 439/136 |
| 7,283,375 B2 | * | 10/2007 | Chen ..................... | G06F 3/023 361/752 |
| 7,309,016 B2 | * | 12/2007 | Lev ....................... | G06F 1/183 235/380 |
| 7,375,511 B2 | * | 5/2008 | Kang .................... | G06F 3/0362 324/207.2 |
| 7,611,371 B2 | * | 11/2009 | Guo ...................... | H01R 13/447 439/367 |
| 8,186,726 B2 | * | 5/2012 | Zuo ...................... | H04M 1/0274 292/1 |
| 8,199,464 B2 | * | 6/2012 | Zuo ...................... | H01R 13/447 200/302.1 |

(Continued)

FOREIGN PATENT DOCUMENTS

JP    9167539 A    6/1997
JP    4012380 B2   9/2007
(Continued)

*Primary Examiner* — Timothy J Thompson
*Assistant Examiner* — Muhammed Azam

(57) ABSTRACT

A key device comprises a housing in which a key hole is formed, a side key unit assembled at the key hole of the housing, and a gap of a predetermined thickness formed between a portion of the assembled side key unit located within the key hole and the key hole, wherein the gap is secured by processing any one or both of the side key unit located within the key hole or the housing in which the side key unit is assembled.

18 Claims, 14 Drawing Sheets

(56) References Cited

U.S. PATENT DOCUMENTS

| | | | | |
|---|---|---|---|---|
| 8,223,484 B2* | 7/2012 | Zhu | H04M 1/0262 | 361/679.01 |
| 8,251,409 B2* | 8/2012 | Chang | H04M 1/0249 | 292/1 |
| 8,502,097 B2* | 8/2013 | Aldana | H01H 13/85 | 200/293 |
| 8,536,478 B2* | 9/2013 | Li | H01H 15/24 | 200/536 |
| 8,636,525 B2* | 1/2014 | Sobig | H01R 13/447 | 439/136 |
| 8,710,382 B2* | 4/2014 | Huang | H01H 13/83 | 200/5 A |
| 8,824,153 B2* | 9/2014 | Chang | G06K 7/0039 | 361/737 |
| 8,926,345 B2* | 1/2015 | Kim | G06K 13/0825 | 439/142 |
| 8,953,331 B2* | 2/2015 | Sugimoto | E05B 19/0082 | 292/341.17 |
| 9,426,919 B2* | 8/2016 | Wee | H05K 7/14 | |
| 9,436,896 B2* | 9/2016 | Hsu | H05K 7/1461 | |
| 9,625,949 B2* | 4/2017 | Lee | H04M 1/0202 | |
| 10,056,204 B2* | 8/2018 | Lee | H01H 13/705 | |
| 10,212,833 B2* | 2/2019 | Seo | H01H 13/04 | |
| 10,437,289 B2* | 10/2019 | Chang | G06F 1/1656 | |
| 2004/0002356 A1* | 1/2004 | Honda | G06F 3/0338 | 455/550.1 |
| 2005/0140653 A1* | 6/2005 | Pletikosa | G06F 3/0213 | 345/168 |
| 2006/0073848 A1* | 4/2006 | Kwon | H01Q 1/084 | 455/558 |
| 2007/0042816 A1* | 2/2007 | Chan | H04M 1/66 | 455/575.1 |
| 2007/0046637 A1* | 3/2007 | Choo | G06F 3/0202 | 345/169 |
| 2007/0268659 A1* | 11/2007 | Chen | H01H 13/14 | 361/679.08 |
| 2007/0272534 A1* | 11/2007 | Iohara | H01H 13/704 | 200/512 |
| 2007/0275772 A1* | 11/2007 | Moon | H04M 1/236 | 455/575.1 |
| 2008/0125182 A1* | 5/2008 | Park | G06F 3/0362 | 455/566 |
| 2008/0277253 A1* | 11/2008 | Kenmochi | H01H 13/7006 | 200/314 |
| 2009/0126428 A1* | 5/2009 | Chang | H01H 23/143 | 70/344 |
| 2009/0158793 A1* | 6/2009 | Liu | H01H 13/86 | 70/408 |
| 2009/0241621 A1* | 10/2009 | Shi | H01H 13/06 | 70/395 |
| 2009/0321237 A1* | 12/2009 | Chiu | H01H 13/807 | 200/341 |
| 2010/0027202 A1* | 2/2010 | Lv | H01H 3/12 | 361/679.01 |
| 2010/0213043 A1* | 8/2010 | Chen | H01H 13/705 | 200/5 A |
| 2011/0042193 A1* | 2/2011 | Wei | H01H 15/10 | 200/329 |
| 2011/0182047 A1* | 7/2011 | Ouyang | H01H 13/14 | 361/807 |
| 2011/0192709 A1* | 8/2011 | Xiao | H01H 1/26 | 200/341 |
| 2011/0226598 A1* | 9/2011 | Ouyang | H01H 21/22 | 200/341 |
| 2011/0228493 A1* | 9/2011 | Liang | H01H 13/705 | 361/752 |
| 2011/0228494 A1* | 9/2011 | Xiao | H01H 13/705 | 361/752 |
| 2011/0235300 A1* | 9/2011 | Liang | H01H 9/0235 | 361/807 |
| 2012/0006667 A1* | 1/2012 | Chen | H01H 13/76 | 200/5 B |
| 2012/0149477 A1* | 6/2012 | Park | G06F 3/0202 | 463/43 |
| 2012/0325634 A1* | 12/2012 | Yang | H01H 13/807 | 200/341 |
| 2013/0114199 A1* | 5/2013 | Jung | H01H 13/702 | 361/679.09 |
| 2013/0114225 A1* | 5/2013 | Schack | H05K 5/0208 | 361/781 |
| 2013/0162541 A1* | 6/2013 | Liu | H04M 1/236 | 345/169 |
| 2013/0213782 A1* | 8/2013 | Wang | H04M 1/0202 | 200/329 |
| 2014/0065860 A1* | 3/2014 | Wang | H01R 13/447 | 439/136 |
| 2014/0134859 A1* | 5/2014 | Lee | H01R 13/447 | 439/136 |
| 2014/0218877 A1* | 8/2014 | Wei | H04B 1/3816 | 361/752 |
| 2014/0247568 A1* | 9/2014 | Lin | H04B 1/3818 | 361/754 |
| 2015/0007501 A1* | 1/2015 | Liang | H04M 1/18 | 49/463 |
| 2017/0238431 A1* | 8/2017 | Lee | H05K 5/0017 | 361/752 |
| 2018/0218194 A1* | 8/2018 | Lee | G06K 9/00013 | |

FOREIGN PATENT DOCUMENTS

| | | |
|---|---|---|
| JP | 4496557 B2 | 4/2010 |
| KR | 1998-0068014 U | 12/1998 |
| KR | 0180447 Y1 | 2/2000 |
| KR | 0518008 B1 | 9/2005 |
| KR | 2013-0065981 A | 6/2013 |

* cited by examiner

KEY DEVICE OF ELECTRONIC DEVICE

CROSS-REFERENCE TO RELATED APPLICATION(S) AND CLAIM OF PRIORITY

The present application is related to and claims priority under 35 U.S.C. § 119(a) from Korean patent application filed on Feb. 12, 2016 in the Korean intellectual property office and assigned serial number 10-2016-0016286, the entire disclosure of which is hereby incorporated by reference.

TECHNICAL FIELD

Various exemplary embodiments of the present invention relate to a key device of an electronic device.

BACKGROUND

In general, in an electronic device including a mobile terminal for mobile communication, several input means are used. In a keypad for inputting a numeral or for selecting a menu, a numeral key and a navigation key are mounted; and, in addition to such keys, for user convenience, a side button or key is additionally provided to be exposed to the outside of the terminal.

The side button or key exposed to the outside of the terminal is connected to a main Printed Circuit Board (PCB) to be used for adjustment of a communication volume while communicating and for movement of a displayed menu.

For assembly of the side button or key in a housing of the electronic device, the housing was conventionally designed to form a slope between a gap of a product exterior and a gap within a key assembly by injection; however, nowadays, particularly for application of a metal case, a key hole should be processed at a side surface of the housing by a flat end mill processing instead of injection. In this case, the key hole is processed without a side wall slope; thus, the side key unit is assembled such that an outer edge gap of a key that forms an external appearance of a product maintains the same gap to the inside of the key assembly. Therefore, a micro gap is formed that enables a gap between the side key unit and the key hole to be maintained the same.

For example, when an outer edge gap is 0.03 mm, an internal gap may be maintained to 0.03 mm, and when a width direction thickness of the key housing is 1.3 mm, a width of a micro gap may be also 1.3 mm.

However, as importance of a design (external appearance quality) of the electronic device increases, a gap of a side key unit, side cover, or window has been reduced. However, in the side key unit as a driving body, a click impression of a key as well as management of a gap of an external appearance becomes a major element that enhances completeness of a product.

In such a situation, for a product quality, i.e., for gap management in relation to a key external appearance and movement prevention of a key, when the key gap is minimized, a micro gap is included between the side key unit and the housing. Accordingly, a foreign substance from daily life such as cosmetic, lotion, coffee, cold medicine, and cola may easily enter; the entered foreign substance may spread widely to a front surface of a gap portion of the key due to surface tension thereof; and, while the entered foreign substance becomes sequentially solidified (phenomenon in which viscosity increases), a frictional force increases and thus, when the key operates, an uncomfortable click impression is caused.

When a metal case is applied, if a processing step for improving a function is added in addition to a step of forming a key hole for assembling a key, the processing number increases; thus, a processing time and a unit cost may increase.

SUMMARY

To address the above-discussed deficiencies, it is a primary object to provide a key device of an electronic device and a method of assembling the same that ameliorates the problem that a click impression is deteriorated by pollution from a foreign substance that minimizes a gap between a side key unit and a housing where the side key unit is designed to stably maintain an initial performance of a product.

In accordance with an aspect of the present disclosure, a key device of an electronic device comprises: a housing in which a key hole is formed; a side key unit assembled at the key hole of the housing; and a gap of a predetermined thickness formed between a portion of the assembled side key unit located within the key hole and the key hole, wherein the gap is secured by processing any one or both of the side key unit located within the key hole or the housing in which the side key unit is assembled.

In accordance with an another aspect of the present disclosure, a method of assembling a key device of an electronic device comprises: assembling a housing including a key hole with a side key unit in which a key rubber and a button are formed in the key hole, the key rubber being located at an internal space of the housing and the button being exposed to the outside of the housing, wherein a gap of a predetermined thickness is formed between a portion of the assembled side key unit located within the key hole and the key hole, and the gap is secured by processing any one or both of the side key unit located within the key hole or the housing in which the side key unit is assembled.

In accordance with a further another aspect of the present disclosure, an electronic device having a key device comprises: a housing comprising a first surface, a second surface facing in a direction opposite to that of the first surface, and a side surface that encloses at least a portion of a space between the first surface and the second surface; a display exposed through the first surface of the housing; an opening formed at one surface of the first surface, the second surface, or the side surface of the housing; a penetration hole comprising at least one internal surface connected to the opening and that penetrates the one surface of the first surface, the second surface, or the side surface of the housing in a first direction substantially perpendicular to the one surface and formed in a second direction perpendicular to the first direction; and a key having a size and shape that may pass through the opening and the penetration hole and inserted to move in the first direction and comprising at least one external surface facing the internal surface of the penetration hole, wherein the internal surface of the penetration hole or the external surface of the key form a first area in which a first gap is formed between the internal surface of the penetration hole and the external surface of the key and a second area in which a second gap with a second thickness greater than a first thickness of the first gap is formed, and the first area is adjacent to the opening rather than the second area.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
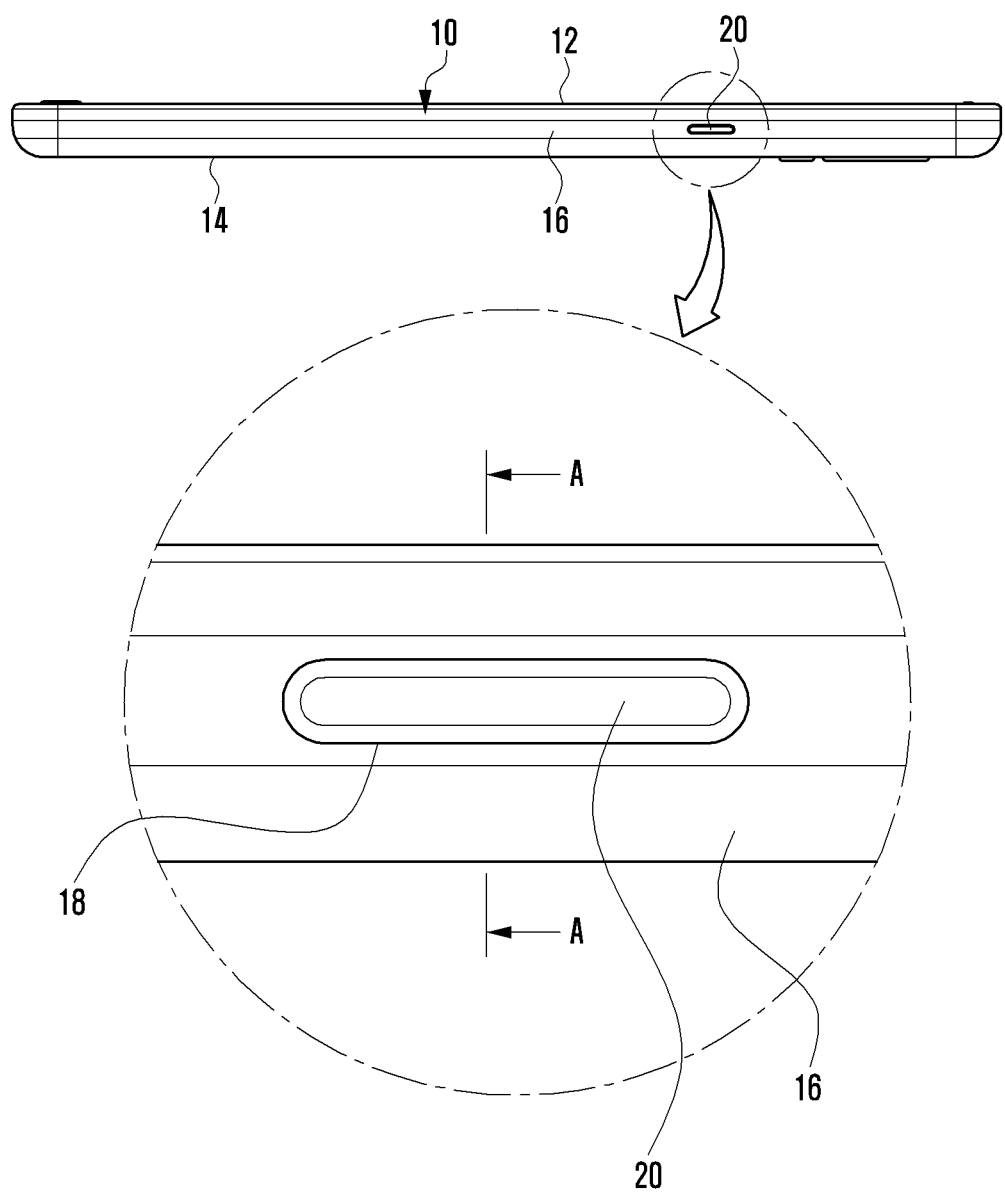
FIG. 1A is a partial front view illustrating a mounting state of a side key unit of an electronic device according to various exemplary embodiments of the present invention.

FIGS. 1A through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, the present disclosure will be described with reference to the accompanying drawings. Although specific embodiments are illustrated in the drawings and related detailed descriptions are discussed in the present specification, the present disclosure may have various modifications and several embodiments. However, various embodiments of the present disclosure are not limited to a specific implementation form and it should be understood that the present disclosure includes all changes and/or equivalents and substitutes included in the spirit and scope of various embodiments of the present disclosure. In connection with descriptions of the drawings, similar components are designated by the same reference numeral.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

In various embodiments of the present disclosure, the expression "or" or "at least one of A or/and B" includes any or all of combinations of words listed together. For example, the expression "A or B" or "at least A or/and B" may include A, may include B, or may include both A and B.

The expression "1", "2", "first", or "second" used in various embodiments of the present disclosure may modify various components of the various embodiments but does not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

The expression "configured to" uses in the present disclosure may be replaced, according to situations, with "suitable for". "having the capacity to", "designed to", "adapted to", "made to", or "capable of". The term "configured to" may not always mean "specially designed to". In some situations, "device configured to" may mean that the device can "do something" with other devices or components. For example, a context "processor configured to execute A, B, and C" may mean a dedicated processor (for example, embedded processor) for executing a corresponding operation, or a generic-purpose processor (for example, CPU or application processor) capable of executing corresponding operations by using at least one software program stored in a memory device.

The terms used in the present disclosure is to merely describe a specific embodiment, and is not intended to limit the scope of other embodiments. A singular form may include a plural form. All the terms including a technical or scientific term may have the same meaning as terms generally understood by those skilled in the prior art. The terms defined in a general dictionary may be interpreted as having the same or similar meaning in a context of related technology, and are not interpreted abnormally or excessively unless clearly defined in the present disclosure. According to situations, the terms defined in the present disclosure cannot be interpreted as excluding the embodiments of the present disclosure.

Figure 1B:
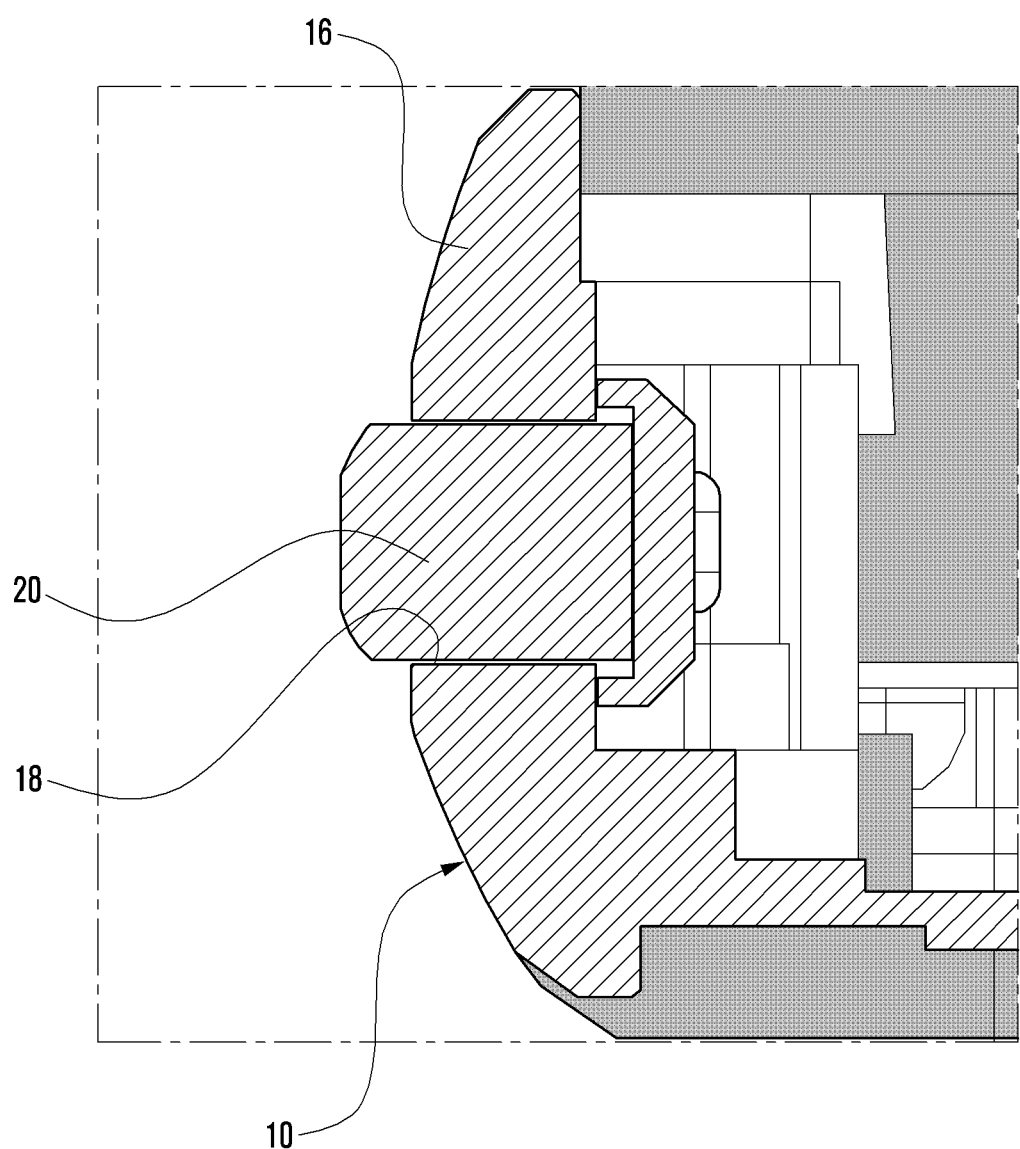
FIG. 1B is a cross-sectional view illustrating the side key unit taken along line A-A of FIG. 1A.

FIG. 1A is a partial front view illustrating a mounting state of a side key unit of an electronic device according to various exemplary embodiments of the present invention, and FIG. 1B is a cross-sectional view illustrating the side key unit taken along line A-A of FIG. 1A.

With reference to FIG. 1, an electronic device according to various exemplary embodiments of the present invention may include a key device, and the key device may be, for example, a side key unit 20 installed at a side wall of a housing 10 of the electronic device.

The housing 10 may include a first surface 12, a second surface 14 facing in a direction opposite to that of the first surface 12, and a side surface 16 that encloses at least a portion of space between the first surface 12 and the second surface 14, and a display (not shown) may be exposed through the first surface 12 of the housing 10. Further, at one of the first surface 12, the second surface 14, or the side surface 16 of the housing 10, an opening 18 may be formed.

Figure 2:
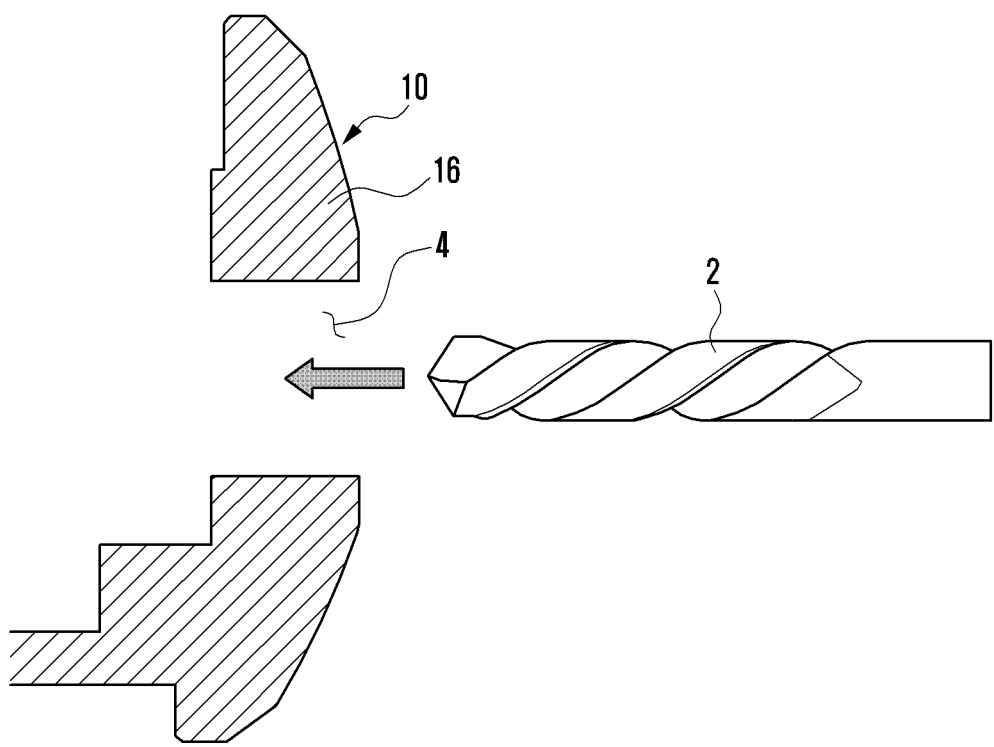
FIG. 2 is a schematic diagram illustrating an example of forming a key hole in a housing of an electronic device according to various exemplary embodiments of the present invention.

FIG. 2 is a schematic diagram illustrating an example of forming a key hole at a housing of an electronic device according to various exemplary embodiments of the present invention, and FIG. 3 is a cross-sectional view illustrating a state in which a side key unit is assembled at the key hole of FIG. 2.

As shown in FIG. 2, the housing 10 of the electronic device may include a case, and at the side surface 16 of the housing 10, a key hole 4 may be formed using a processing tool such as a flat end mill 2. At the formed key hole 4, the side key unit 20 of FIG. 3 may be assembled.

Figure 3A:
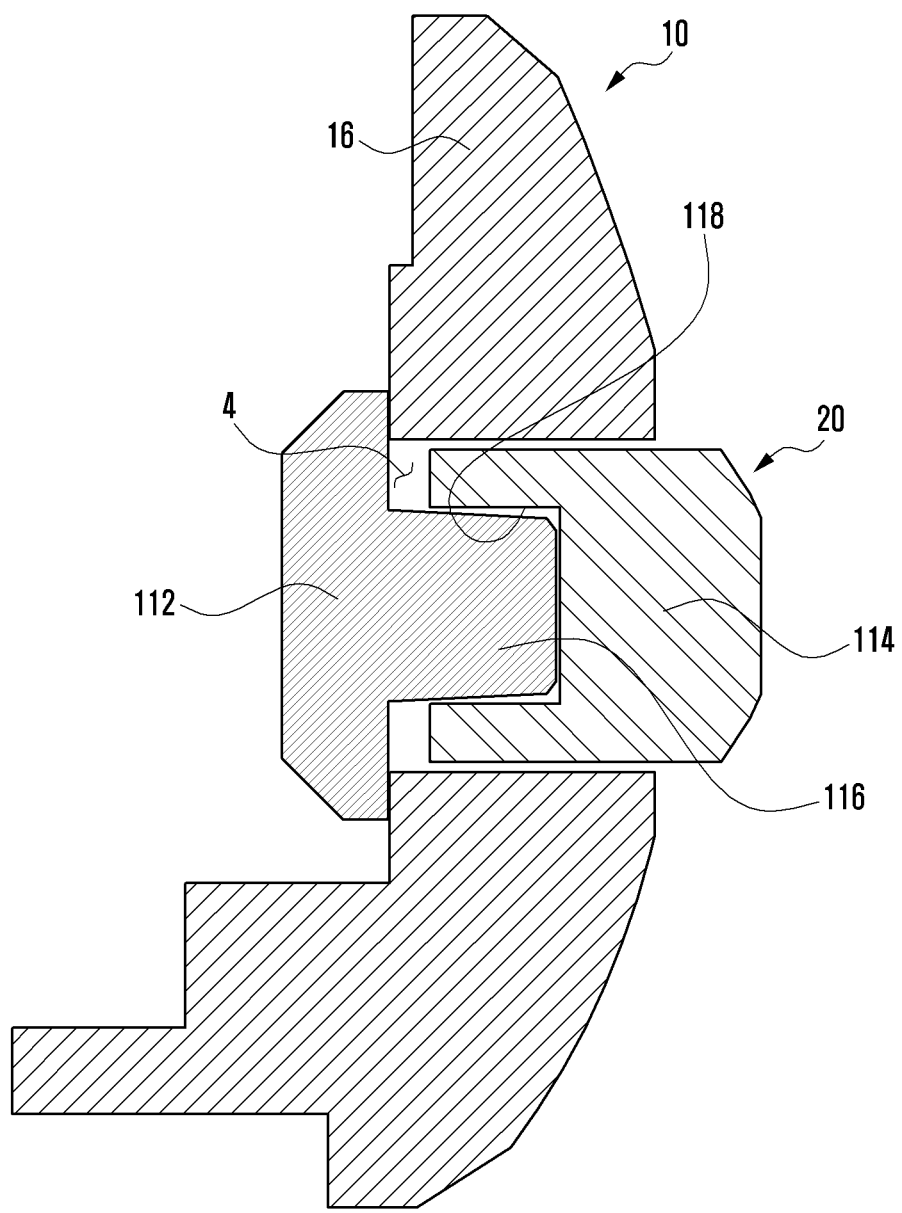
FIGS. 3A-3B are cross-sectional views illustrating a state in which a side key unit is assembled at a key hole.

With reference to FIG. 3A, the side key unit 20 may include key rubber 112 and a button 114 coupled to the key rubber 112. The key rubber 112 may be located at an internal space of the housing 10, and the button 114 may be assembled to be exposed to the outside of the housing 10.

Figure 4A:
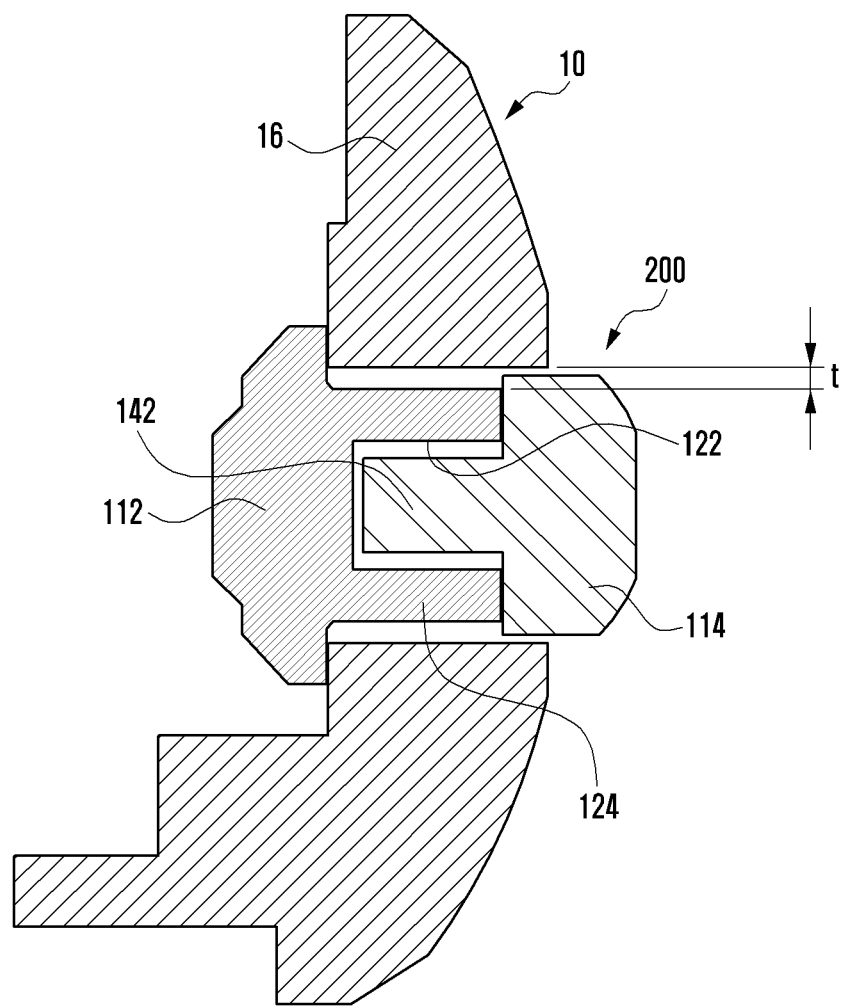
FIGS. 4A-4B are cross-sectional views illustrating a state in which a gap is secured at a side key unit according to a first exemplary embodiment of the present invention.

According to an exemplary embodiment, the key rubber 112 has a protrusion 116 facing the button 114, the button 114 has a groove 118 into which the protrusion 116 of the key rubber 112 is inserted, and the protrusion 116 of the key rubber 112 may be inserted and coupled to the groove 118 of the button 114. In contrast, as shown in FIG. 4A, the protrusion is formed in the button and a groove is formed at the key rubber; thus, the protrusion of the button may be inserted and coupled to the groove.

The key hole 4 may include a penetration hole that penetrates one surface connected to the opening 18 formed at one of the first surface 12, the second surface 14, and the side surface 16 of the housing 10 in a first direction substantially perpendicular to the one surface and having at least one internal surface formed in a second direction perpendicular to the first direction.

According to an exemplary embodiment, the internal surface of the penetration hole may include a first portion extended parallel to at least a portion of the key hole 4 and a second portion protruded in the second direction from the first portion.

According to an exemplary embodiment, when the side key unit 20 receives a pressure to move in a first direction, the key rubber 112 disposed at an internal space of the housing 10 may further include a dome-shaped structure (not shown) configured to change at least a form partially by a movement; and a Printed Circuit Board (PCB) (not shown) may be disposed at a space within the housing 10.

According to an exemplary embodiment, the dome-shaped structure included in the key rubber 112 may be disposed at a PCB, and when the side key unit 20 receives a pressure in a first direction, a form may be partially changed to be electrically connected to the PCB.

According to an exemplary embodiment, the button 114 partially exposed at the outside of the housing 10 may further include a support member or a movement prevention member that contacts the side key unit 20 to limit a movement of the first direction.

The side key unit 20 assembled with the key rubber 112 and the button 114 has a size and shape that may pass through the key hole 4 in which the opening 18 and the penetration hole are formed, and when the side key unit 20 is assembled in the key hole 4, the side key unit 20 may be inserted to move in a first direction of the penetration hole and may include at least one external surface facing an internal surface of the penetration hole.

Figure 4B:
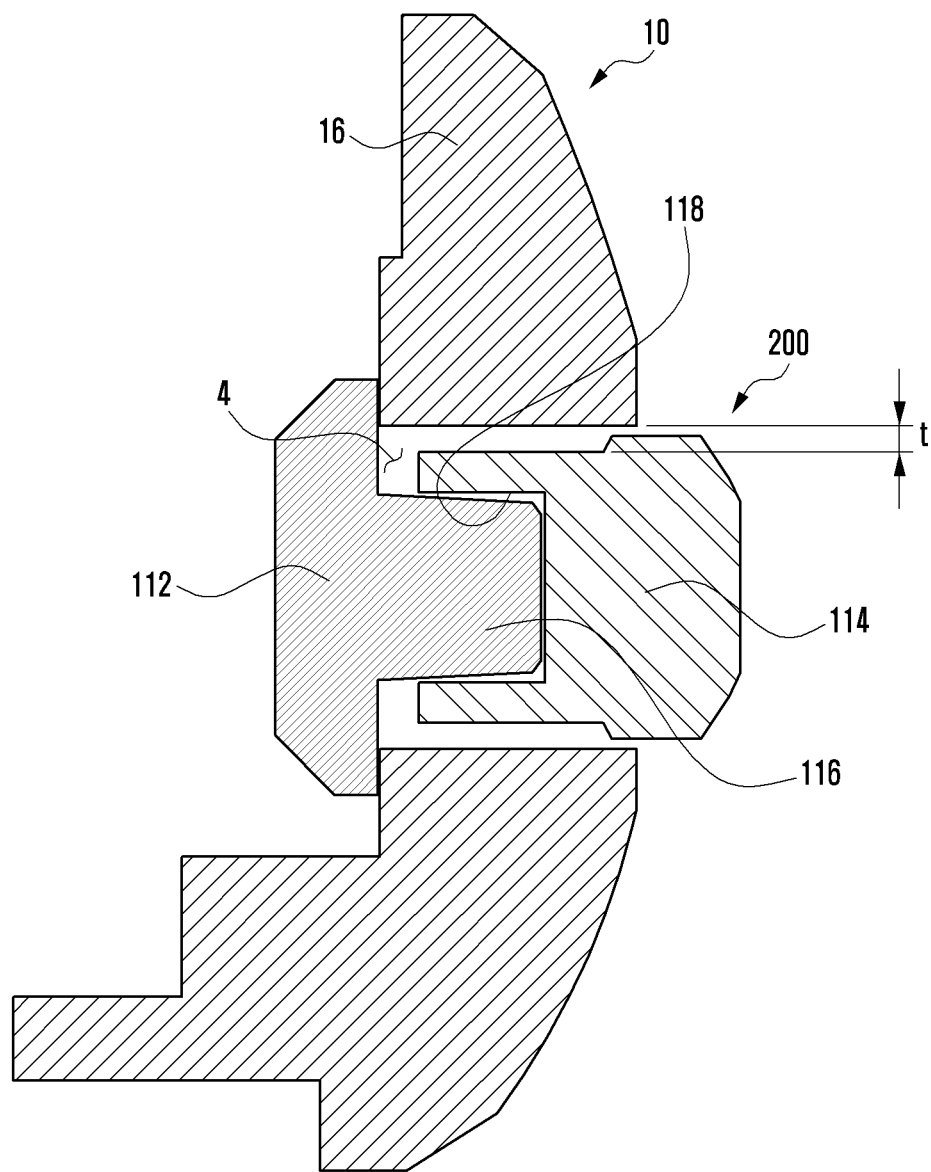
Figure 5:
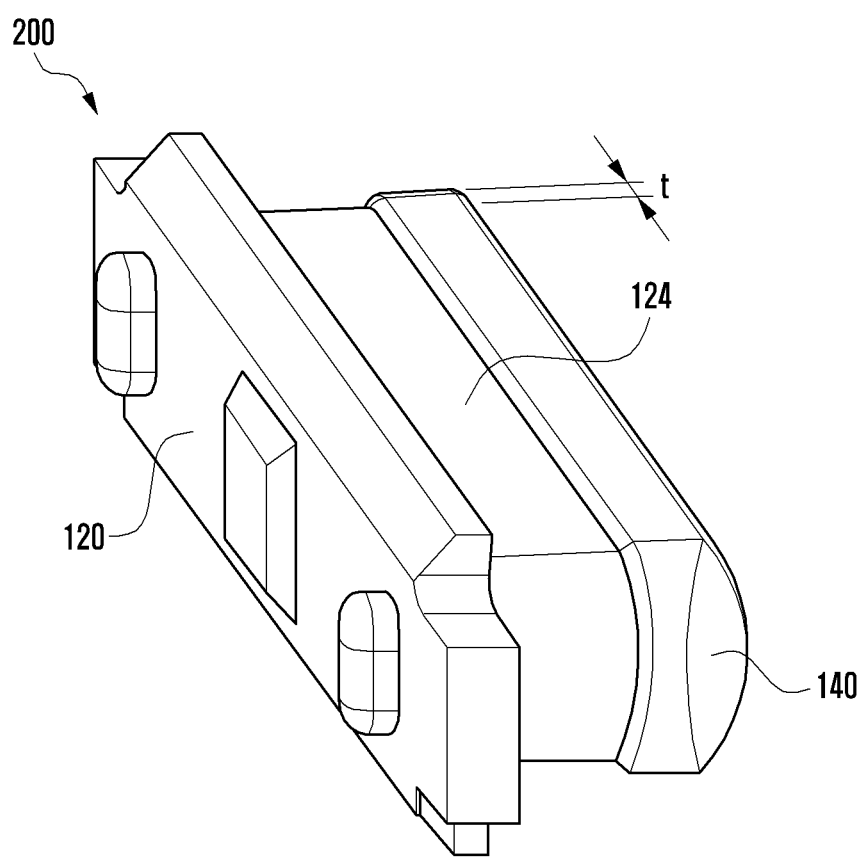
FIG. 5 is a perspective view illustrating a side key unit.

FIGS. 4A-4B are cross-sectional views illustrating a state in which a gap is secured at a side key unit according to a first exemplary embodiment of the present invention, and FIG. 5 is a perspective view illustrating the side key unit of FIG. 4.

With reference to FIGS. 4A and 5, a key device according to a first exemplary embodiment of the present invention may form a gap t at a side key unit 200. By performing an undercut processing of a side wall of the side key unit 200 using a T-cut or a forming tool, a gap of a thickness t may be formed within a key hole 4.

Figure 3B:
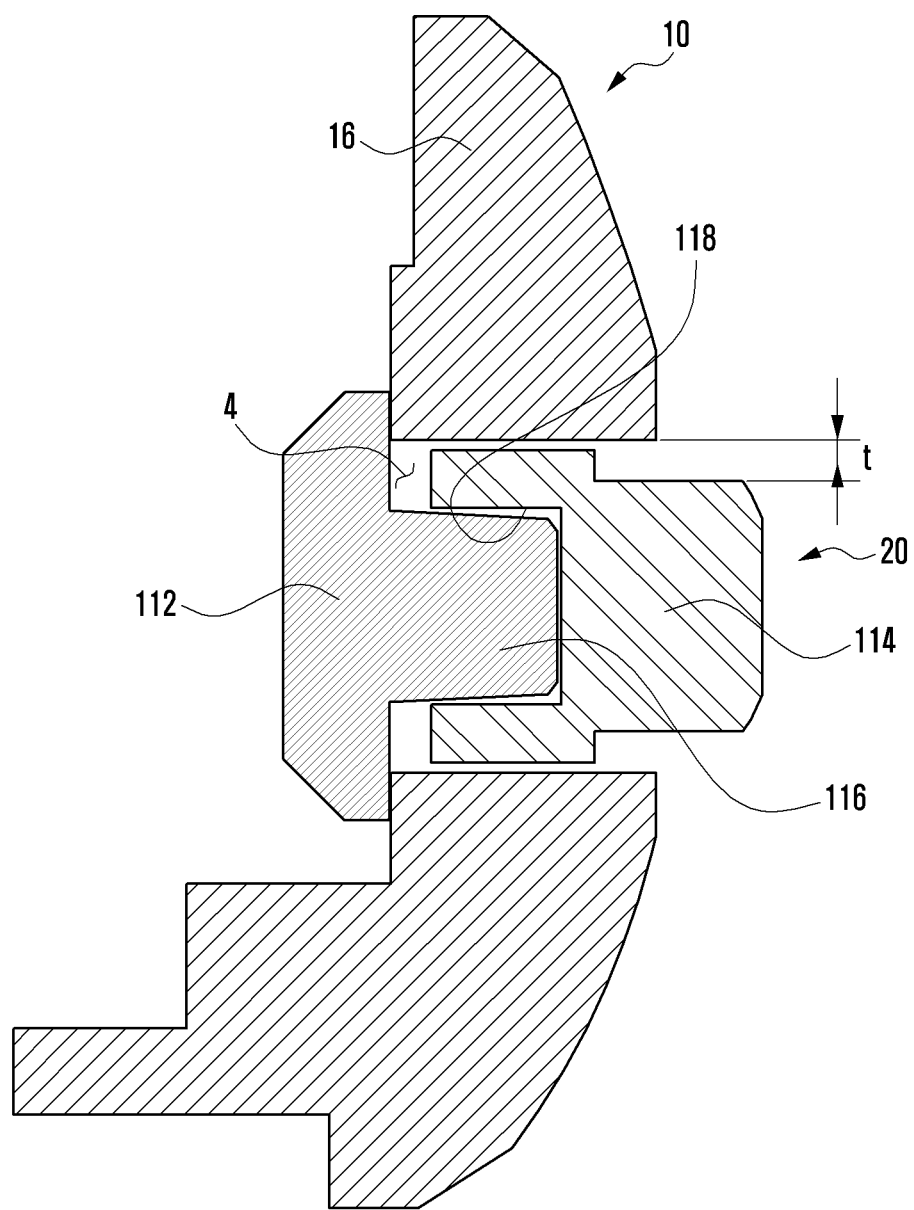

According to an exemplary embodiment, the side key unit 200 may include key rubber 120 and a button 140 coupled to the key rubber 120. The key rubber 120 may be located at an internal space of a housing 10, and the button 140 may be assembled to be exposed to the outside of the housing 10. A gap may be formed between the key rubber 120 of the assembled side key unit 200 and a side wall of the key hole 4. That is, as shown in FIG. 5, by cutting the outside of a protrusion 124 of the key rubber 120, a gap may be formed or by cutting a portion of an outer edge of the button 140, a gap may be formed. As shown in FIG. 3B, by cutting a portion of an outer edge of the button 114, a gap may be formed. Alternatively, as shown in FIG. 4B, by cutting a portion of the outside of the button 114 inserted into the key hole 4, a gap may be formed.

According to an exemplary embodiment, the key rubber 120 has a protrusion 124 that faces the button 140 and having a groove 122 therein, and in the button 140, a protrusion 142 of the button 140 may be inserted and coupled to the groove 122 formed at the protrusion 124 of the key rubber 120. Alternatively, a groove is formed at the protrusion 142 of the button 140, and the protrusion 124 of the key rubber 120 may be inserted and coupled to the groove.

According to an exemplary embodiment, even if an elastic air-tight rubber member encloses a circumference of the side key unit 200 located within the key hole 4, the elastic air-tight rubber member encloses less than a diameter or a width of the key hole 4, compared with a conventionally secured gap between the key hole 4 and the side key unit 200 and thus a gap of 0.1 mm or more may be secured.

Therefore, when the side key unit 200 is assembled at the key hole 4, a micro gap may be formed between an internal surface of the penetration hole and/or an external surface of the side key unit 200 of an opening.

For example, as shown in FIG. 4B, the formed micro gap may include a first area in which a first gap is formed between the external surface of the side key unit 200 located at the opening and the key hole 4 and a second area in which a second gap is formed between the internal surface located at the penetration hole and the key hole 4, and in this case the second gap may be greater than the first gap.

Further, the button 140 has a rectangular shape, and in an example of FIG. 5, the button 140 may include a first portion whose side surface has the same first width as that of the protrusion 124 of the key rubber 120 and a second portion whose upper portion and lower surface are protruded to have a second width wider than the first width, but the button 140 may be formed in a different shape according to an electronic device.

Figure 6:
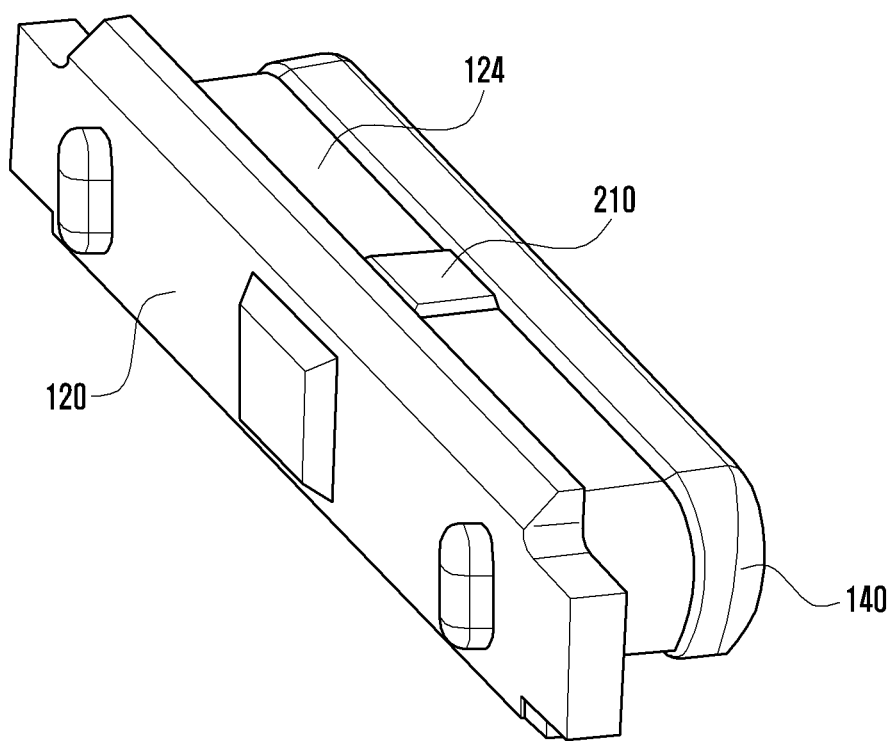
FIG. 6 is a perspective view illustrating one movement prevention portion disposed at a side key unit.

FIG. 6 is a perspective view illustrating one movement prevention portion disposed at a side key unit according to various exemplary embodiments of the present invention.

With reference to FIG. 6, the side key unit 200 located within the key hole 4 may include at least one movement prevention portion. For example, one movement prevention portion 210 may be protruded at the center of the protrusion 124 of the key rubber 120. A guide protrusion (not shown) may be formed at both sides of the protruded movement prevention portion 210, for example at a side wall of the key hole 4.

Figure 7:
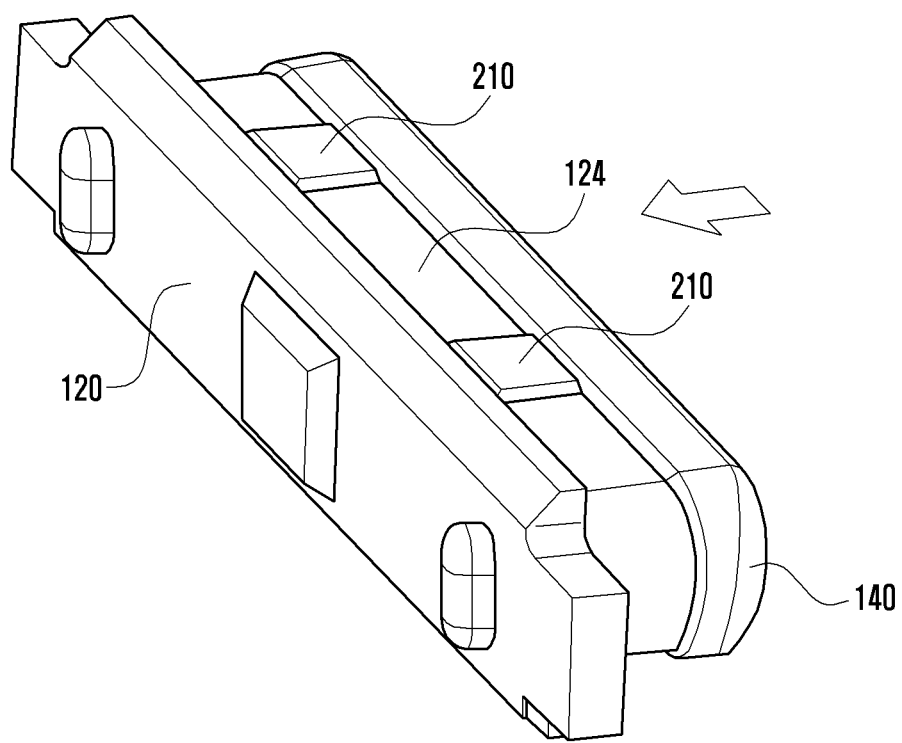
FIG. 7 is a perspective view illustrating two movement prevention portions disposed at a side key unit.

As shown in FIG. 7, at both sides of the protrusion 124 of the key rubber 120, a pair of movement prevention portions 210 may protrude at a predetermined gap, and in this case, a guide protrusion (not shown) may be formed at a side wall of the key hole 4 to correspond between a pair of protruded movement prevention portions 210. When the side key unit 200 receives a pressure to move in a first direction designated by an arrow of FIG. 7, the button 114 is guided by a guide protrusion formed at the side wall of the key hole 4 between a pair of protruded movement prevention portions 210; thus, a movement of the button 114 in a direction other than the first direction may be limited.

Figure 8:
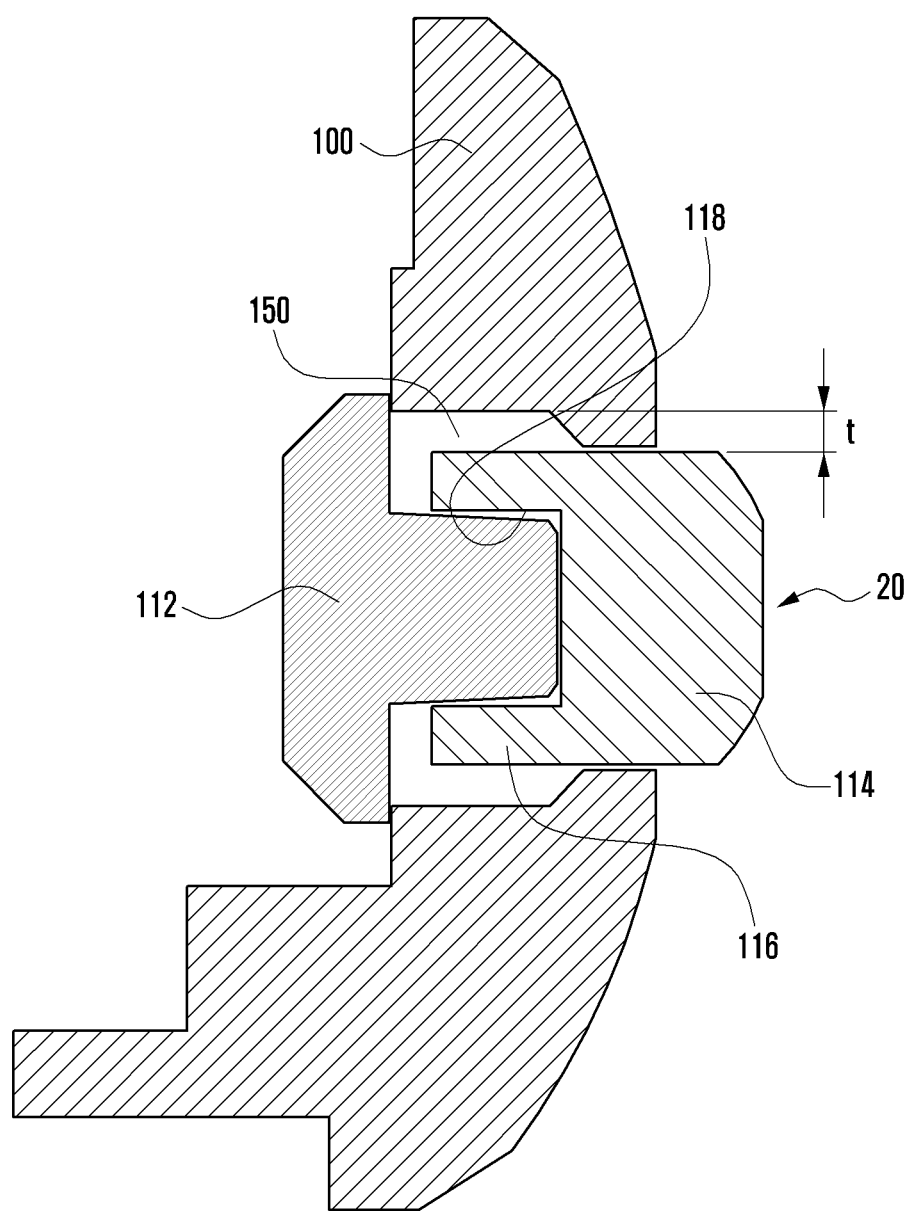
FIG. 8 is a cross-sectional view illustrating a state in which a gap is secured at a key hole of a housing according to a second exemplary embodiment of the present invention.
Figure 9:
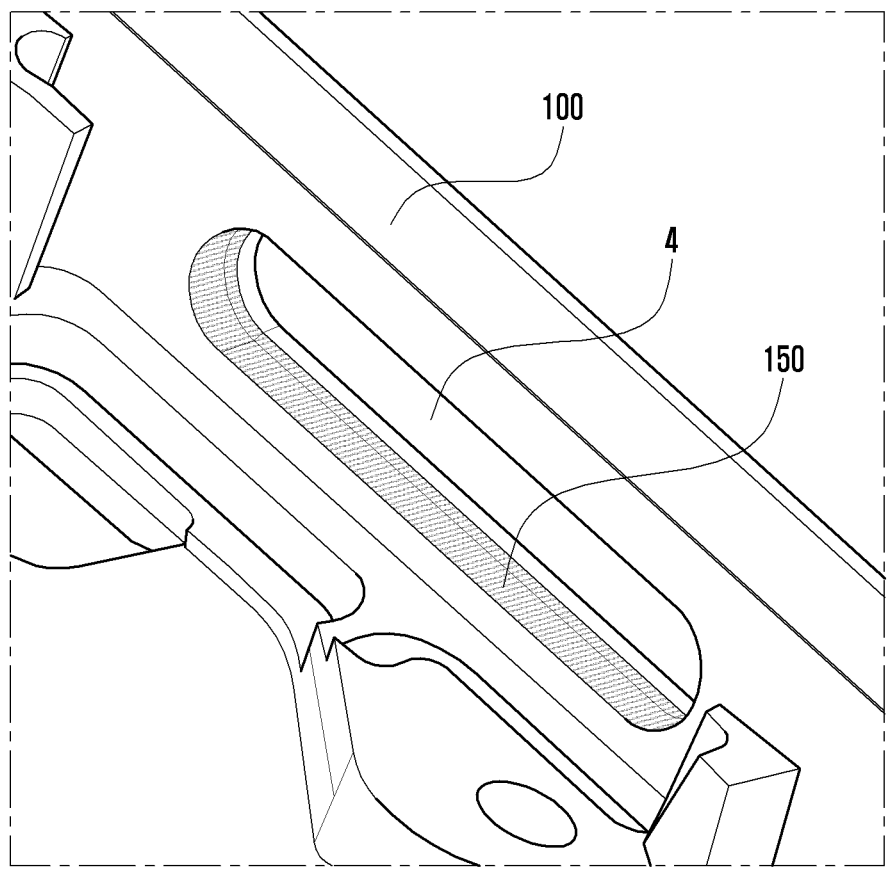
FIG. 9 is a partial perspective view illustrating a gap.

FIG. 8 is a cross-sectional view illustrating a state in which a gap is secured at a key hole of a housing according to a second exemplary embodiment of the present invention, and FIG. 9 is a partial perspective view illustrating the gap of FIG. 8.

With reference to FIGS. 8 and 9, a key device according to a second exemplary embodiment of the present invention may form a gap tin a housing 100. At a side wall of a key hole 4 formed in the housing 100, the key hole 4 may be formed using a processing tool such as a flat end mill. By performing an undercut processing including a slope processing of the side wall of the formed key hole 4 using a T-cut or a forming tool, a gap 150 of a thickness t may be formed within the key hole 4. At the key hole 4 in which a gap t is formed, the side key unit 20 may be assembled.

According to an exemplary embodiment, the side key unit 20 may include key rubber 112 and a button 114 coupled to the key rubber 112. The key rubber 112 may be located at an internal space of the housing 100, and the button 114 may be assembled to be exposed to the outside of the housing 100.

According to an exemplary embodiment, the key rubber 112 may have a protrusion 116 facing the button 114. The button 114 may have a groove 118 for insertion of the protrusion 116 of the key rubber 112. The protrusion 116 of the key rubber 112 may be inserted and coupled to a groove 118 of the button 114. Alternatively, the protrusion 116 facing the key rubber 112 may be formed in the button 114, and the key rubber 112 may have a groove 118 for insertion of the protrusion 116; thus, the protrusion 116 of the button 114 may be inserted and coupled to the groove 118 of the key rubber 112.

Figure 10:
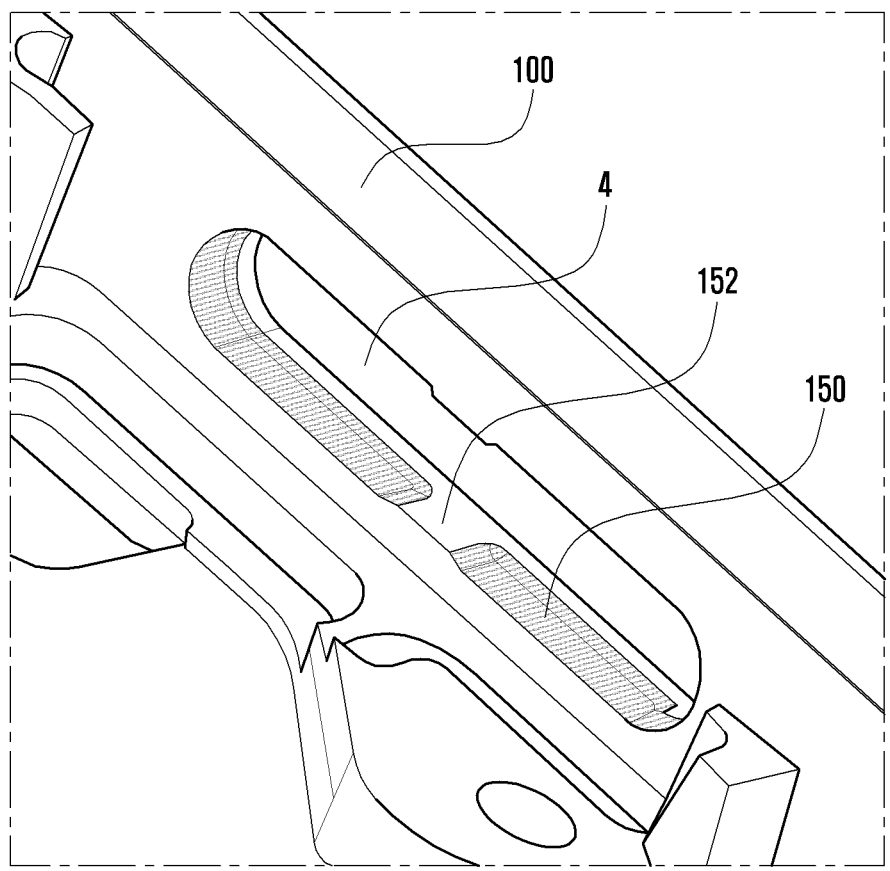
FIG. 10 is a partial perspective view illustrating one movement prevention portion disposed at a gap.

With reference to FIG. 10, the key hole 4 may include at least one movement prevention portion.

According to an exemplary embodiment, a movement prevention portion 152 may protrude to the center of the key hole 4, and a guide protrusion (not shown) may be formed at the protrusion 124 of the key rubber 120 to correspond thereto. When the side key unit 20 receives a pressure to move in a first direction, the movement prevention portion 152 is guided by the guide protrusion, as in an exemplary embodiment described with reference to FIG. 7; thus, a movement of the movement prevention portion 152 in a direction other than the first direction may be limited.

Figure 11:
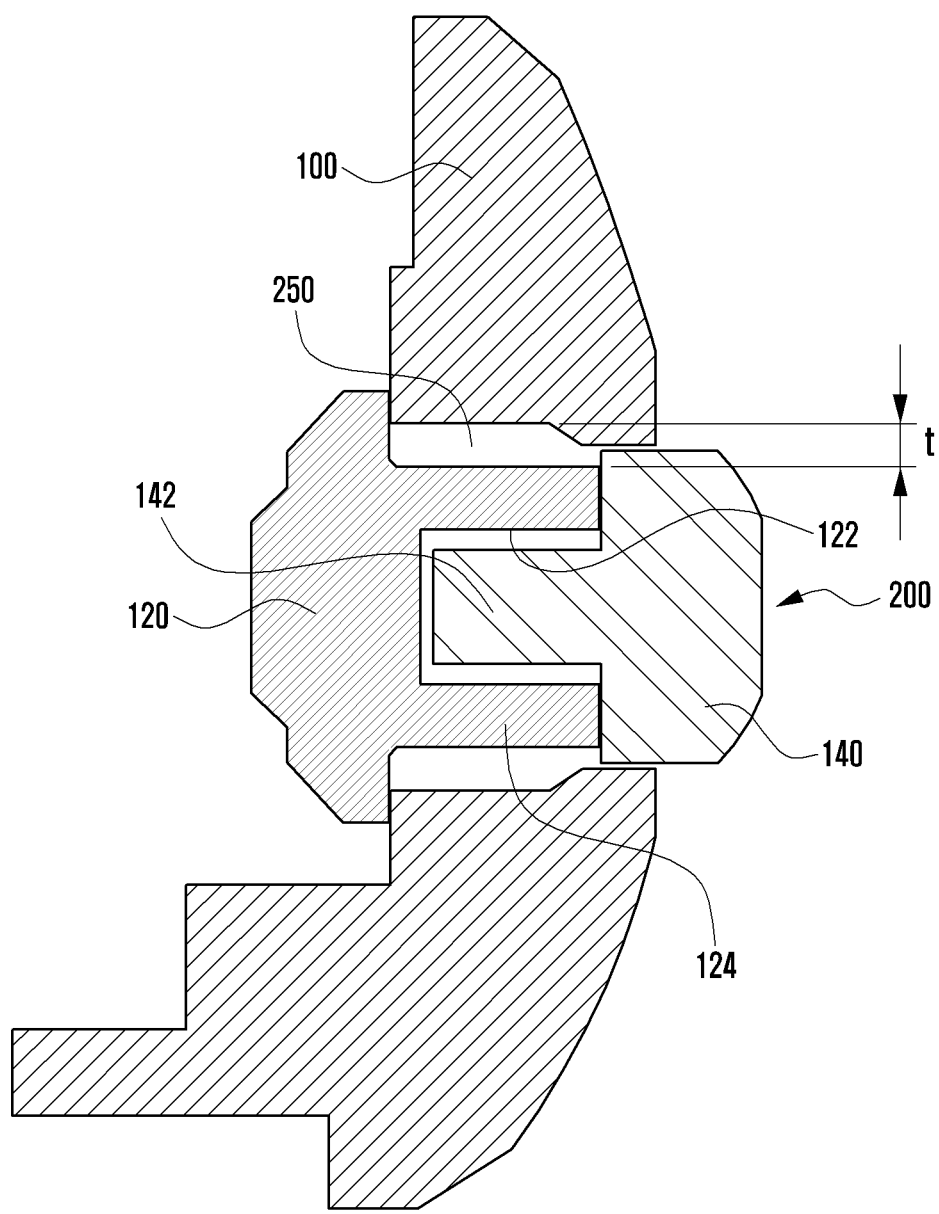
FIG. 11 is a cross-sectional view illustrating a state in which each gap is secured at a side key unit and a housing according to a third exemplary embodiment of the present invention.

FIG. 11 is a cross-sectional view illustrating a state in which each gap is secured at a side key unit and a housing according to a third exemplary embodiment of the present invention.

With reference to FIG. 11, a key device according to a third exemplary embodiment of the present invention may form a gap 250 of a thickness t by processing each of a housing 100 and a side key unit 200. According to an exemplary embodiment, by performing an undercut processing of each of a side wall of the key hole 4 formed in the housing 100 and a side wall of the key hole 4 formed in a side wall of the side key unit 200 using a T-cut or a forming tool, the gap 250 of a thickness T within the key hole 4 may be formed.

According to an exemplary embodiment, when a step portion is formed at the side wall of the side key unit 200 due to a restriction of a processing tool or a space or when a limitation exists in an internal processing amount (under cutting amount) of the key hole 4 of the housing 100, by entirely processing both side walls of the housing 100 and the side key unit 200, the gap 250 of a thickness T may be formed.

By improving a self-cleaning ability at a gap secured through the foregoing first to third exemplary embodiments, spread of a foreign substance into a key device according to various exemplary embodiments of the present invention can be minimized.

For example, super water repellent coating or super oil repellent coating may be applied to a gap secured for improvement of a self-cleaning ability.

Super water repellent coating or super oil repellent coating may include, for example, fluorine coating or AF coating, and an interface tensile force in the gap 150 or 250 of the housing 100 and the side key unit 200 may be reduced by such super water repellent coating or super oil repellent coating. Therefore, spread of an external pollutant material in a gap can be minimized because of surface tension.

As described above, a key device according to various exemplary embodiments of the present invention can secure an internal gap between a side key unit and a housing, and by minimizing a width (friction surface) of a micro gap, an uncomfortable click impression by a cohesive foreign substance can be prevented; thus, the number of A/S requests of consumers and consumer dissatisfaction due to an operation failure of the side key unit can be largely reduced, and increases in development costs due to a key operation failure can be held down at a product development stage.

A side key unit 20 or 200 of an electronic device according to various embodiments of the present disclosure may be a device including a projection or a communication function. For example, the electronic device may be one or a combination of a smart phone, a tablet Personal Computer (PC), a mobile phone, a video phone, an e-book reader, a desktop PC, a laptop PC, a netbook computer, a Personal Digital Assistant (PDA), a camera, a wearable device (for example, a Head-Mounted-Device (HMD) such as electronic glasses, electronic clothes, and electronic bracelet, an electronic necklace, an electronic appcessory, an electronic tattoo, and a smart watch.

According to some embodiments, the electronic device may be a smart home appliance having a projection function. The smart home appliance may include at least one of a Television (TV), a Digital Video Disk (DVD) player, an audio player, an air conditioner, a cleaner, an oven, a microwave oven, a washing machine, an air cleaner, a set-top box, a TV box (for example, Samsung HomeSync™, Apple TV™, or Google TV™), game consoles, an electronic dictionary, an electronic key, a camcorder, and an electronic frame.

According to some embodiments, the electronic device may include at least one of various types of medical devices (for example, Magnetic Resonance Angiography (MRA), Magnetic Resonance Imaging (MRI), Computed Tomography (CT), a scanner, an ultrasonic device and the like), a navigation device, a Global Positioning System (GPS) receiver, an Event Data Recorder (EDR), a Flight Data Recorder (FDR), a vehicle infotainment device, electronic equipment for a ship (for example, a navigation device for ship, a gyro compass and the like), avionics, a security device, a head unit for a vehicle, an industrial or home robot, an Automatic Teller Machine (ATM) of financial institutions, and a Point Of Sale (POS) device of shops.

According to some embodiments, the electronic device may include at least one of furniture or a part of a building/structure, an electronic board, an electronic signature receiving device, a projector, and various types of measuring devices (for example, a water meter, an electricity meter, a gas meter, a radio wave meter and the like) including a projection function. The electronic device according to various embodiments of the present disclosure may be one or a combination of the above described various devices. Further, the electronic device according to various embodiments of the present disclosure may be a flexible device. It is apparent to those skilled in the art that the electronic device according to various embodiments of the present disclosure is not limited to the above described devices The exemplary embodiments disclosed in the specification and drawings are merely presented to easily describe technical contents of the present disclosure and help the understanding of the present disclosure and are not intended to limit the scope of the present disclosure. Therefore, all changes or modifications derived from the technical idea of the present disclosure as well as the embodiments described herein should be interpreted to belong the scope of the present disclosure.

The electronic device having a side key unit 20 and 200 as a key device according to various embodiments of this present disclosure may include a short range communication module for short range communication. As short range communication technique, Bluetooth, radio frequency identification (RFID), infrared data association (IrDA), ultra wideband (UWB), ZigBee, near field communication (NFC), or the like may be used.

Therefore, the side key units 20 and 200 as a key device according to an exemplary embodiment of the present disclosure can be wirelessly connected to an electronic device by Bluetooth technology.

As described above, the key device of an electronic device according to the present disclosure comprises: a housing in which a key hole is formed; a side key unit assembled at the key hole of the housing; and a predetermined thickness of a gap formed between the assembled side key unit located within the key hole and the key hole, wherein the gap is secured by processing any one or both of the side key unit located within the key hole or the housing in which the side key unit is assembled.

A processing that secures the gap may include undercut using a T-cut or a forming tool.

The side key unit may include a key rubber and a button coupled to the key rubber, and the key rubber is located at an internal space of the housing, and the button is assembled to be exposed to the outside of the housing.

The key device may further include an elastic air-tight rubber member that encloses a side key unit circumference located within the key hole and that encloses less than a diameter or a width of the key hole.

At least one movement prevention portion may be formed at the side key unit located within the key hole or be formed within the key hole into which the side key unit is inserted.

The gap may include coating in order to reduce surface tension of the secured gap, the coating including super water repellent coating or super oil repellent coating.

The method of assembling a key device of an electronic device according to the present disclosure may include: assembling a housing having a key hole with a side key unit in which a key rubber and a button are formed in the key hole, the key rubber being located at an internal space of the housing and the button being exposed to the outside of the housing, wherein a predetermined thickness of a gap is formed between the assembled side key unit located within the key hole and the key hole, and the gap is secured by processing any one or both of the key holes of the side key unit located within the key hole or the housing in which the side key unit is assembled.

The gap may be secured by a processing that undercuts using a T-cut or a forming tool.

A side key unit circumference located within the key hole may be enclosed with an elastic air-tight rubber member, but is enclosed less than a diameter or a width of the key hole.

At least one movement prevention portion may be formed at the side key unit located within the key hole or is formed within the key hole into which the side key unit is inserted.

The gap may include coating in order to reduce surface tension of the secured gap, the coating including super water repellent coating or super oil repellent coating.

The electronic device according to the present disclosure comprises: a housing comprising a first surface, second surface facing in a direction opposite to that of the first surface, and side surface that encloses at least a portion of a space between the first surface and the second surface; a display exposed through the first surface of the housing; an opening formed at one surface of the first surface, second surface, and side surface of the housing; a penetration hole comprising at least one internal surface connected to the opening and that penetrates the one surface of the first surface, second surface, and side surface of the housing in a first direction substantially perpendicular to the one surface and formed in a second direction perpendicular to the first direction; and a key having a size and shape that may pass through the opening and the penetration hole and inserted to move in the first direction and comprising at least one external surface facing the internal surface of the penetration hole, wherein the internal surface of the penetration hole and/or the external surface of the key form a first area in which a first gap is formed between the internal surface of the penetration hole and the external surface of the key and a second area in which a second gap greater than the first gap is formed, and the first area is adjacent to the opening rather than the second area.

The key may include a first portion having a first width and a second portion having a second width wider than the first width.

The internal surface of the penetration hole may include a first portion extended parallel to at least a portion of the key and a second portion protruded in the second direction from the first portion.

The electronic device may further include a support member disposed within the space and that limits a movement of the first direction of the key by contact with the key and may further include a dome-shaped structure disposed within the space to change a form at least partially by movement of the key, when the key receives a pressure of the first direction and a Printed Circuit Board (PCB) disposed within the space, and wherein the dome-shaped structure is disposed at the PCB to be electrically connected to the PCB by a form change, when the key receives a pressure of the first direction.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A key device of an electronic device, the key device comprising:
    a housing in which a key hole is formed;
    a side key unit assembled at the key hole of the housing; and
    a gap of a predetermined thickness formed between a portion of the assembled side key unit located within the key hole and the key hole,
    wherein the gap is secured by processing either or both of the side key unit and the key hole, and
    wherein the gap comprises a coating in order to reduce a surface tension of the gap.

2. The key device of claim 1, wherein the processing that secures the gap comprises undercutting using a T-cut or a forming tool.

3. The key device of claim 1, wherein:
    the side key unit comprises key rubber and a button coupled to the key rubber, and
    the key rubber is located at an internal space of the housing, and the button is assembled to be exposed to an outside of the housing.

4. The key device of claim 1, further comprising an elastic air-tight rubber member that encloses a side key unit circumference located within the key hole and that encloses less than a diameter or a width of the key hole.

5. The key device of claim 1, wherein at least one movement prevention portion is formed on the side key unit located within the key hole.

6. The key device of claim 1, wherein at least one movement prevention portion is formed within the key hole into which the side key unit is inserted.

7. An electronic device, comprising:
    a housing comprising a first surface, a second surface facing in a direction opposite to that of the first surface, and a side surface that encloses at least a portion of a space between the first surface and the second surface;
    a display exposed through the first surface of the housing;
    an opening formed at one surface of the first surface, the second surface, or the side surface of the housing;
    a penetration hole comprising at least one internal surface connected to the opening and that penetrates the one surface of the first surface, the second surface, or the side surface of the housing in a first direction substantially perpendicular to the one surface and formed in a second direction perpendicular to the first direction; and
    a key having a size and shape that may pass through the opening and the penetration hole and inserted to move in the first direction and comprising at least one external surface facing the internal surface of the penetration hole,
    wherein the internal surface of the penetration hole or the external surface of the key forms a first area in which a first gap is formed between the internal surface of the penetration hole and the external surface of the key and a second area in which a second gap with a second thickness greater than a first thickness of the first gap is formed, and the first area is adjacent to the opening rather than the second area, and
    wherein the second gap comprises a coating in order to reduce a surface tension of the second gap.

8. The key device of claim 1, wherein the coating comprises a super water repellent coating or a super oil repellent coating.

9. A method of assembling a key device of an electronic device, the method comprising:
    assembling a housing including a key hole with a side key unit in which a key rubber and a button are formed in the key hole, the key rubber being located at an internal space of the housing and the button being exposed to an outside of the housing,
    wherein a gap of a predetermined thickness is formed between a portion of the assembled side key unit located within the key hole and the key hole,
    wherein the gap is secured by processing either or both of the side key unit and the key hole, and
    wherein the gap comprises a coating in order to reduce a surface tension of the gap.

10. The method of claim 9, wherein the gap is secured by the processing that undercuts using a T-cut or a forming tool.

11. The method of claim 9, wherein a side key unit circumference located within the key hole is enclosed with an elastic air-tight rubber member, but is enclosed less than a diameter or a width of the key hole.

12. The method of claim 9, wherein at least one movement prevention portion is formed on the side key unit located within the key hole or is formed within the key hole into which the side key unit is inserted.

13. The electronic device of claim 7, further comprising a dome-shaped structure disposed within the space and that changes form at least partially based on movement of the key, when the key receives pressure in the first direction.

14. The method of claim 9, wherein the coating comprises a super water repellent coating or a super oil repellent coating.

15. The electronic device of claim 13, further comprising a Printed Circuit Board (PCB) disposed within the space, and
    wherein the dome-shaped structure is disposed at the PCB to be electrically connected to the PCB when the form changes, when the key receives the pressure in the first direction.

16. The electronic device of claim 7, wherein the key comprises a first portion having a first width and a second portion having a second width wider than the first width.

17. The electronic device of claim 7, wherein the internal surface of the penetration hole comprises a first portion extended parallel to at least a portion of the key and a second portion protruded in the second direction from the first portion.

18. The electronic device of claim 7, further comprising a support member disposed within the space and that limits a movement in the first direction of the key by contact with the key.

\* \* \* \* \*